(12) United States Patent
Kim

(10) Patent No.: US 12,315,581 B2
(45) Date of Patent: May 27, 2025

(54) MEMORY SYSTEM, MEMORY CONTROLLER AND METHOD FOR OPERATING MEMORY SYSTEM

(71) Applicant: SK hynix Inc., Gyeonggi-do (KR)

(72) Inventor: Seong Chan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 58 days.

(21) Appl. No.: 18/184,679

(22) Filed: Mar. 16, 2023

(65) Prior Publication Data

US 2024/0153576 A1    May 9, 2024

(30) Foreign Application Priority Data

Nov. 9, 2022   (KR) .......................... 10-2022-0148499

(51) Int. Cl.
*G11C 29/38*       (2006.01)
(52) U.S. Cl.
CPC .................................... *G11C 29/38* (2013.01)
(58) Field of Classification Search
None
See application file for complete search history.

(56) References Cited

U.S. PATENT DOCUMENTS

| | | | |
|---|---|---|---|
| 6,014,336 A * | 1/2000 | Powell .................. | G11C 29/44 365/201 |
| 10,635,526 B2 | 4/2020 | Yin et al. | |
| 11,495,313 B1 * | 11/2022 | Kirschner ........ | G11C 29/56008 |
| 2014/0192583 A1 * | 7/2014 | Rajan ....................... | G11C 7/10 365/63 |
| 2016/0365156 A1 | 12/2016 | Busi et al. | |
| 2019/0035486 A1 * | 1/2019 | Busi ................. | G11C 29/56008 |
| 2020/0089410 A1 * | 3/2020 | Park ....................... | G06F 3/064 |

FOREIGN PATENT DOCUMENTS

| | | | | |
|---|---|---|---|---|
| EP | 4064001 A1 * | 9/2022 | ............... | G06F 1/22 |
| KR | 10-2021-0042855 A | 4/2021 | | |

* cited by examiner

*Primary Examiner* — Mark D Featherstone
*Assistant Examiner* — Matthew W Wahlin
(74) *Attorney, Agent, or Firm* — IP & T GROUP LLP

(57) ABSTRACT

Embodiments of the disclosed technology relate to a memory system, a memory controller and a method for operating a memory system. According to the embodiments of the disclosed technology, a memory system may include a volatile memory accessed through a plurality of address fields, and divided into a plurality of subareas on the basis of a reference address field among the plurality of address fields; and a memory controller including a plurality of cores to which the plurality of subareas are allocated and which generate test signals corresponding to a test pattern. The memory controller may transmit the test signals generated in the plurality of cores, respectively, to the volatile memory.

20 Claims, 18 Drawing Sheets

FIG.6
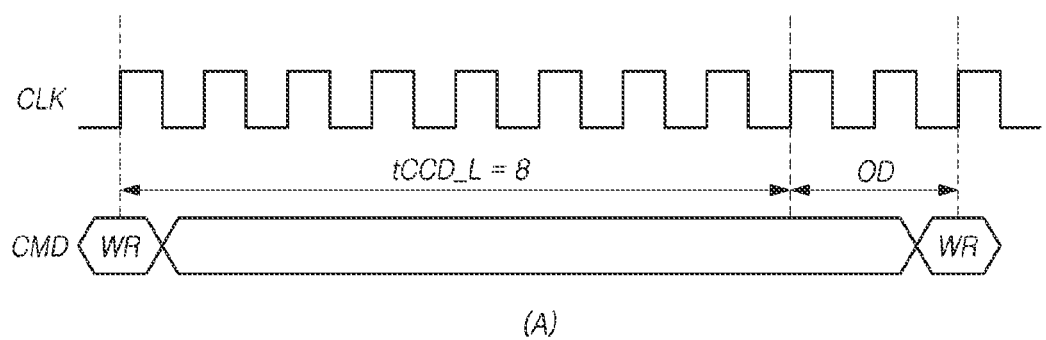
(A)
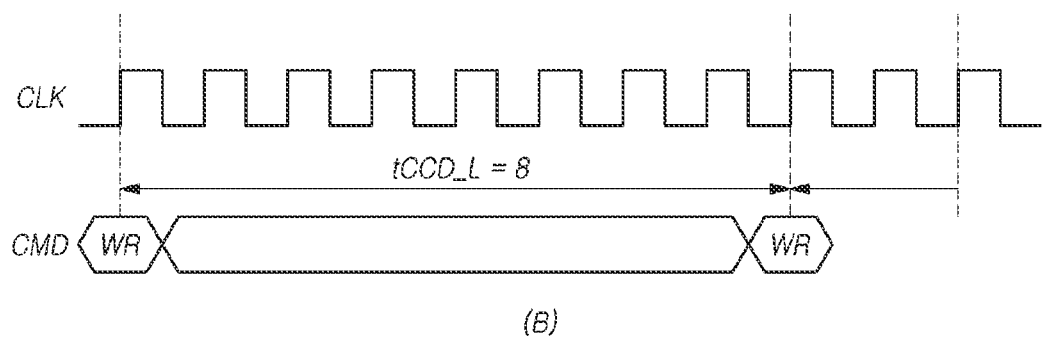
(B)

*FIG. 7*
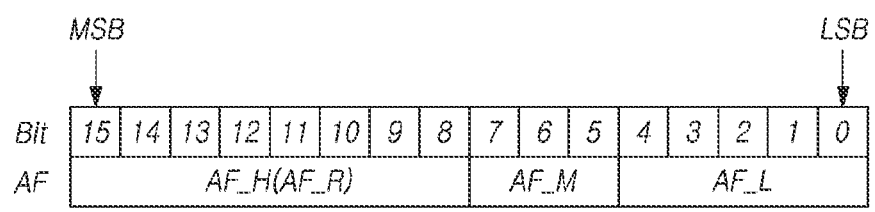
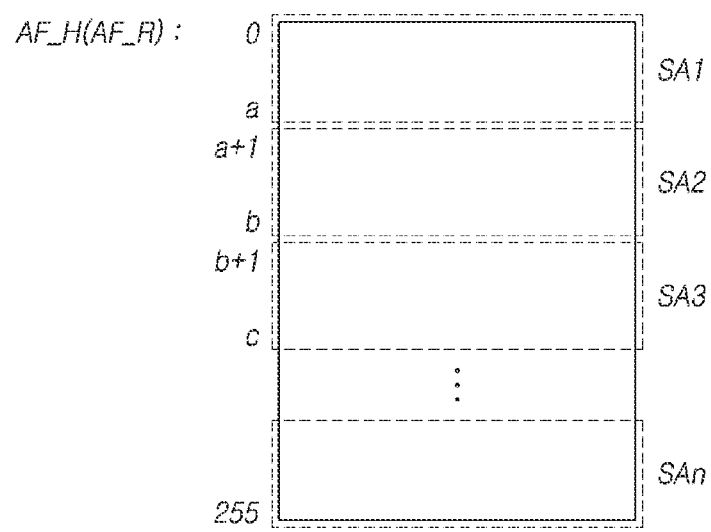

FIG.10

| | BANK1 | BANK2 | BANK3 | BANK8 | |
|---|---|---|---|---|---|
| | 0 – 63 | 0 – 63 | 0 – 63 | 0 – 63 | SA1 |
| | 64 – 127 | 64 – 127 | 64 – 127 | 64 – 127 | SA2 |
| | 128 – 191 | 128 – 191 | 128 – 191 | 128 – 191 | SA3 |
| | 192 – 255 | 192 – 255 | 192 – 255 | 192 – 255 | SA4 |

*FIG. 13*

FIG.14
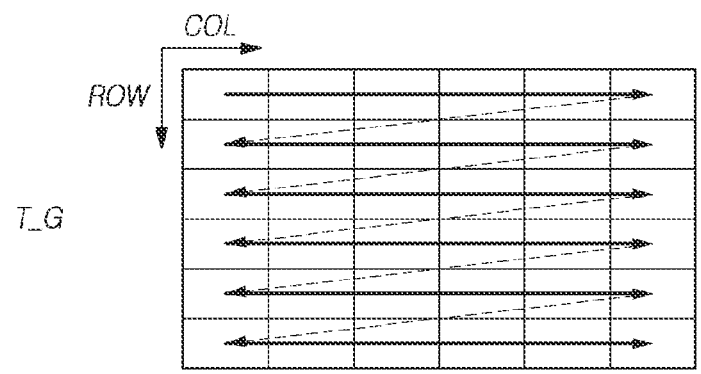
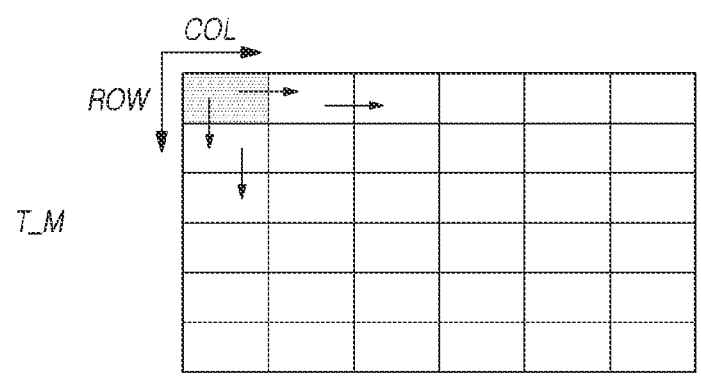
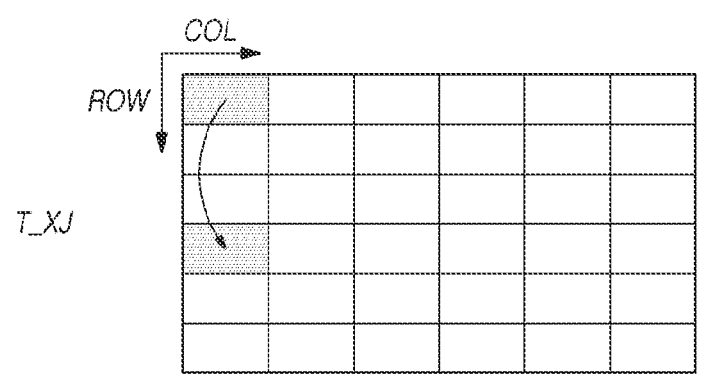

MEMORY SYSTEM, MEMORY CONTROLLER AND METHOD FOR OPERATING MEMORY SYSTEM

CROSS-REFERENCE TO RELATED APPLICATION

The present application claims priority under 35 U.S.C. § 119(a) to Korean Patent Application No. 10-2022-0148499 filed on Nov. 9, 2022, which is incorporated herein by reference in its entirety.

BACKGROUND

1. Technical Field

Various embodiments of the present disclosure generally relate to a memory system, a memory controller and a method for operating a memory system.

2. Related Art

A memory system corresponding to a storage device is a device which stores data based on a request of a host, such as a computer, a mobile terminal such as a smartphone, a tablet, and various electronic devices. The memory system may be a device which stores data in a magnetic disk, such as a hard disk drive (HDD), or a device which stores data in a nonvolatile memory, such as a solid state drive (SDD), a universal flash storage (UFS) device and an embedded MMC (eMMC) device.

The memory system may further include a memory controller for controlling a memory device (e.g., a volatile memory/a nonvolatile memory). The memory controller may receive a command from the host, and may perform or control an operation for reading, writing or erasing data with respect to the memory device included in the memory system, based on the received command. The memory controller may drive firmware for performing logical calculations to execute or control these operations.

The memory system may perform a test for determining whether a memory operates normally.

SUMMARY

Various embodiments of the present disclosure are directed to a memory system, a memory controller and a method for operating a memory system, capable of generating test signals of tight timing to test a memory.

In an embodiment of the present disclosure, a memory system may include: a nonvolatile memory configured to store data; a volatile memory accessed through a plurality of address fields, and divided into a plurality of subareas on the basis of a reference address field among the plurality of address fields; and a memory controller including a plurality of cores to which the plurality of subareas are allocated and which generate test signals corresponding to a test pattern, and a volatile memory control unit which transmits commands, corresponding to the test signals generated in the plurality of respective cores, to the volatile memory.

In an embodiment of the present disclosure, a memory controller may include: a processor including a plurality of cores to which a plurality of subareas divided on the basis of a reference address field among a plurality of address fields for an access to a volatile memory are allocated and which generate test signals corresponding to a test pattern; and a volatile memory control unit configured to provide an interface with the volatile memory, and transmit commands, corresponding to the test signals generated in the plurality of respective cores, to the volatile memory.

In an embodiment of the present disclosure, a memory system may include: a non-volatile memory device; a volatile memory device; a direct memory access (DMA) unit; and a controller configured to: control the non-volatile memory device to perform an operation, request the DMA unit to control the volatile memory device to perform an operation, and perform, without involvement of the DMA unit, a test operation independently on each of groups, wherein each of the groups includes rows of memory cells within the volatile memory device.

In an embodiment of the present disclosure, a method for operating a memory system may include: dividing a volatile memory into a plurality of subareas on the basis of a most significant address field among a plurality of address fields; allocating the plurality of subareas to a plurality of cores; generating test signals through the plurality of cores; and transmitting commands corresponding to the test signals to the volatile memory.

According to the embodiments of the disclosed technology, test signals of tight timing may be generated to test a memory.

According to the embodiments of the disclosed technology, a test time may be shortened through the test signals of tight timing.

BRIEF DESCRIPTION OF THE DRAWINGS

FIG. 6 is a timing diagram illustrating timings of a clock and a command inputted to a memory based on an embodiment of the disclosed technology.

FIG. 7 is a diagram illustrating address bits and address fields of a memory based on an embodiment of the disclosed technology.

FIG. 10 is a diagram illustrating an example of subareas of FIG. 9 based on an embodiment of the disclosed technology.

FIG. 13 is a diagram illustrating subareas of FIG. 12 based on an embodiment of the disclosed technology.

FIG. 14 is a diagram illustrating examples of test patterns based on an embodiment of the disclosed technology.

DETAILED DESCRIPTION

Hereinafter, embodiments of the disclosed technology will be described in detail with reference to the accompanying drawings.

Figure 1:
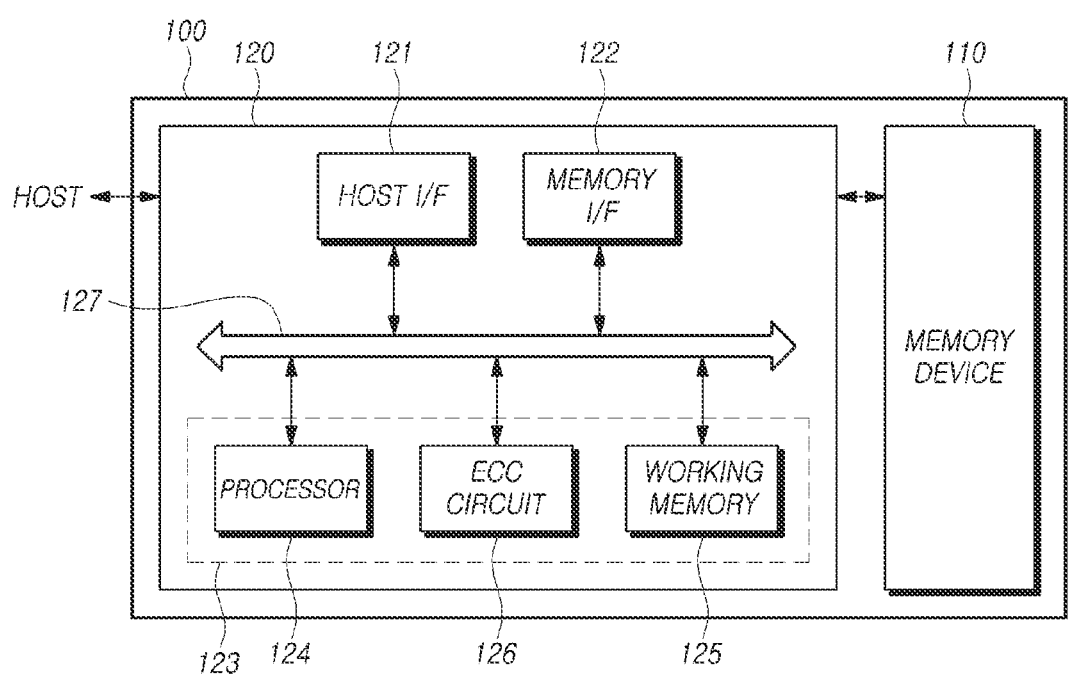
FIG. 1 is a schematic configuration diagram of a memory system based on an embodiment of the disclosed technology.

FIG. 1 is a schematic configuration diagram of a memory system based on an embodiment of the disclosed technology.

Referring to FIG. 1, the memory system 100 based on the embodiment of the disclosed technology may include a memory device 110 which stores data, and a memory controller 120 which controls the memory device 110.

The memory device 110 includes a plurality of memory blocks, and operates in response to the control of the memory controller 120. Operations of the memory device 110 may include, for example, a read operation, a program operation (also referred to as a write operation) and an erase operation.

The memory device 110 may include a memory cell array including a plurality of memory cells (also simply referred to as "cells") which store data. Such a memory cell array may exist in a memory block.

For example, the memory device 110 may be implemented into various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (SU-RAM).

The memory device 110 may be implemented in a three-dimensional array structure. The embodiment of the disclosed technology may be applied to not only a flash memory device in which a charge storage layer is configured by a conductive floating gate but also a charge trap flash (CTF) in which a charge storage layer is configured by a dielectric layer.

The memory device 110 is configured to receive a command, an address and so forth from the memory controller 120 and access an area in the memory cell array which is selected by the address. The memory device 110 may perform an operation corresponding to the command, on the area selected by the address.

For example, the memory device 110 may perform a program operation, a read operation and an erase operation. In this connection, in the program operation, the memory device 110 may program data to an area selected by the address. In the read operation, the memory device 110 may read data from an area selected by the address. In the erase operation, the memory device 110 may erase data stored in an area selected by the address.

The memory controller 120 may control write (program), read, erase and background operations on the memory device 110. For example, the background operation may include at least one among a garbage collection (GC) operation, a wear leveling (WL) operation, a bad block management (BBM) operation, and so forth.

The memory controller 120 may control the operation of the memory device 110 according to a request of a host. Unlike this, the memory controller 120 may control the operation of the memory device 110 regardless of a request of the host.

The memory controller 120 and the host may be devices which are separated from each other. As the case may be, the memory controller 120 and the host may be implemented by being integrated into one device. Hereunder, it will be described as an example that the memory controller 120 and the host are devices which are separated from each other.

Referring to FIG. 1, the memory controller 120 may include a memory interface 122 and a control circuit 123, and may further include a host interface 121.

The host interface 121 provides an interface for communication with the host.

When receiving a command from the host, the control circuit 123 may receive the command through the host interface 121, and may perform an operation of processing the received command.

The memory interface 122 is coupled to the memory device 110 to provide an interface for communication with the memory device 110. That is, the memory interface 122 may be configured to provide the interface between the memory device 110 and the memory controller 120 in response to the control of the control circuit 123.

The control circuit 123 performs the general control operation of the memory controller 120 to control the operation of the memory device 110. To this end, for instance, the control circuit 123 may include at least one of a processor 124 and a working memory 125, and as the case may be, may further include an error detection and correction circuit (ECC circuit) 126.

The processor 124 may control the general operation of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 is configured to randomize data received from the host. For example, the processor 124 may randomize data received from the host, by using a randomizing seed. Randomized data as data to be stored is provided to the memory device 110 and is programmed to the memory cell array.

The processor 124 is configured to derandomize data received from the memory device 110, in a read operation.

For example, the processor 124 may derandomize data received from the memory device 110, by using a derandomizing seed. Derandomized data may be outputted to the host.

The processor 124 may control the operation of the memory controller 120 by executing firmware. Namely, in order to control the general operation of the memory controller 120 and perform a logic calculation, the processor 124 may execute (drive) firmware loaded on the working memory 125, upon booting.

The firmware as a program to be executed in the memory system 100 may include various functional layers.

For example, the firmware may include at least one among a flash translation layer (FTL) which performs a translating function between a logical address requested to the memory system 100 from the host and a physical address of the memory device 110, a host interface layer (HIL) which serves to analyze a command requested to the memory system 100 as a storage device from the host and transfer the command to the flash translation layer (FTL), and a flash interface layer (FIL) which transfers a command, instructed from the flash translation layer (FTL), to the memory device 110.

For instance, such a firmware may be stored in the memory device 110 and then be loaded to the working memory 125.

The working memory 125 may store firmware, a program code, a command and data which are necessary to drive the memory controller 120. Such a working memory 125 as, for example, a volatile memory may include at least one among an SRAM (static RAM), a DRAM (dynamic RAM) and an SDRAM (synchronous DRAM).

The error detection and correction circuit 126 may be configured to detect an error bit of checking target data and correct the detected error bit, by using an error correction code. Here, the checking target data may be, for example, data stored in the working memory 125, data read from the memory device 110, or the like.

The error detection and correction circuit 126 may be implemented to decode data by using an error correction code. The error detection and correction circuit 126 may be implemented by various code decoders. For example, a decoder which performs unsystematic code decoding or a decoder which performs systematic code decoding may be used.

For example, the error detection and correction circuit 126 may detect an error bit for each read data, in the unit of sector. Namely, each read data may be constituted by a plurality of sectors. A sector may mean a data unit smaller than a page being the read unit of a flash memory. Sectors constituting each read data may be matched with one another by the medium of an address.

The error detection and correction circuit 126 may calculate a bit error rate (BER), and may determine whether an error is correctable or not, in the unit of sector. For example, in the case where a bit error rate (BER) is higher than a reference value, the error detection and correction circuit 126 may determine that a corresponding sector is uncorrectable or a fail. On the other hand, in the case where a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to the last. There may be one or more sectors that are determined to be uncorrectable. The error detection and correction circuit 126 may transfer information (for example, address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the likes, a data bus for transferring various data, and so forth.

The above-described components 121, 122, 124, 125 and 126 of the memory controller 120 are for an illustration purpose only. Some of the above-described components 121, 122, 124, 125 and 126 of the memory controller 120 may be omitted, or some of the above-described components 121, 122, 124, 125 and 126 of the memory controller 120 may be integrated into one. As the case may be, in addition to the above-described components 121, 122, 124, 125 and 126 of the memory controller 120, one or more other components may be added.

Hereinbelow, the memory device 110 will be described in further detail with reference to FIG. 2.

Figure 2:
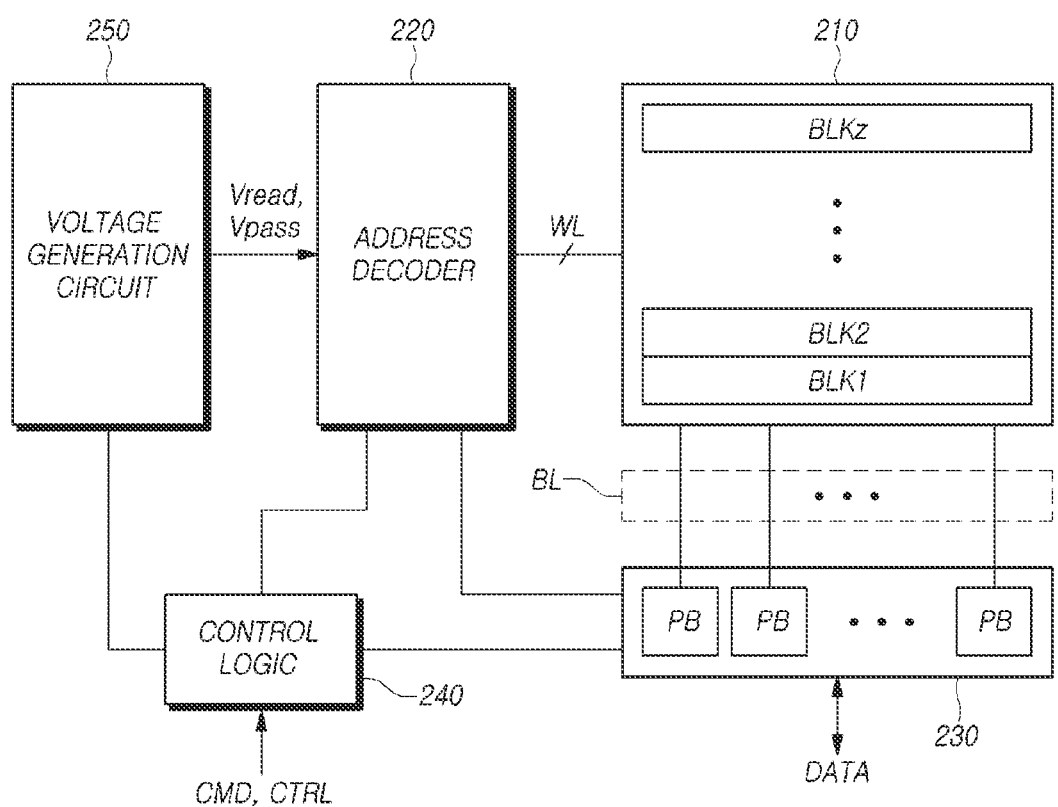
FIG. 2 is a block diagram schematically illustrating a memory device based on an embodiment of the disclosed technology.

FIG. 2 is a block diagram schematically illustrating a memory device based on an embodiment of the disclosed technology.

Referring to FIG. 2, the memory device 110 based on the embodiment of the disclosed technology may include a memory cell array 210, an address decoder 220, a read and write circuit 230, a control logic 240, and a voltage generation circuit 250.

The memory cell array 210 may include a plurality of memory blocks BLK1 to BLKz, where z is a natural number of 2 or greater.

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures.

The memory cell array 210 may be configured by a memory cell array of a two-dimensional structure, or as the case may be, may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For still another instance, each of the plurality of memory cells included in the memory cell array 210 may be a triple level cell (TLC) which stores 3-bit data. For yet another instance, each of the plurality of memory cells included in the memory cell array 210 may be a quad level cell (QLC) which stores 4-bit data. For still yet another instance, the memory cell array 210 may include a plurality of memory cells, each of which stores 5 or more-bit data.

Referring to FIG. 2, the address decoder 220, the read and write circuit 230, the control logic 240 and the voltage generation circuit 250 may operate as a peripheral circuit which drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory device 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which take charge of a data processing function, and as the case may be, may further include cache buffers which take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. As an embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory device 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A memory cell which is coupled to one of the plurality of word lines WL and one of the plurality of bit lines BL may be defined. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate which is surrounded by a dielectric and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

As the case may be, at least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
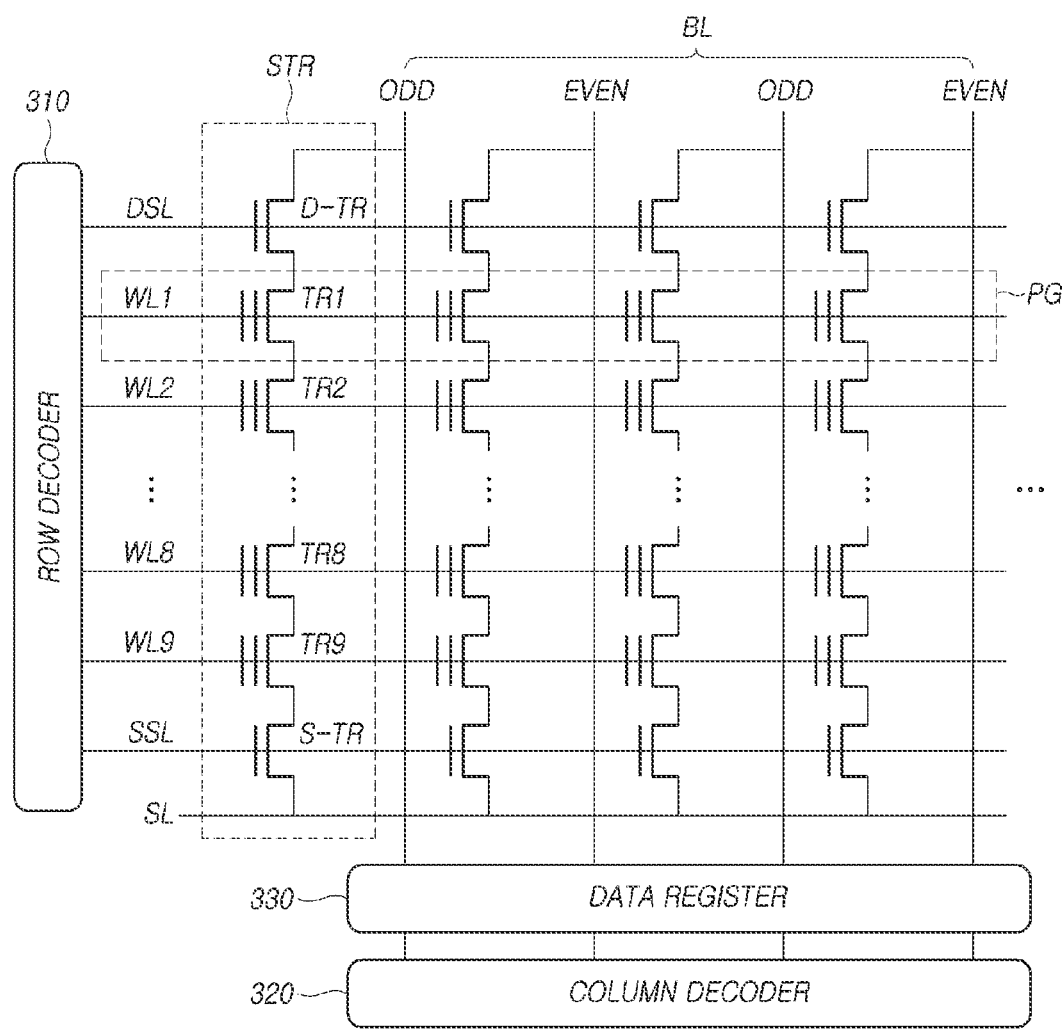
FIG. 3 is a diagram illustrating the structure of word lines and bit lines of the memory device based on an embodiment of the disclosed technology.

FIG. 3 is a diagram illustrating the structure of word lines and bit lines of the memory device based on the embodiment of the disclosed technology.

Referring to FIG. 3, in the memory device 110, there exist a core area in which memory cells MC are gathered and an auxiliary area which corresponds to the remaining area except the core area and supports the operation of the memory cell array 210.

The core area may be configured by pages PG and strings STR. In such a core area, a plurality of word lines WL1 to WL9 and a plurality of bit lines BL are disposed to intersect with each other.

The plurality of word lines WL1 to WL9 may be coupled with a row decoder 310, and the plurality of bit lines BL may be coupled with a column decoder 320. A data register 330 corresponding to the read and write circuit 230 may exist between the plurality of bit lines BL and the column decoder 320.

The plurality of word lines WL1 to WL9 correspond to a plurality of pages PG.

For example, as illustrated in FIG. 3, each of the plurality of word lines WL1 to WL9 may correspond to one page PG. Unlike this, in the case where the size of each of the plurality of word lines WL1 to WL9 is large, each of the plurality of word lines WL1 to WL9 may correspond to at least two (for example, two or four) pages PG. Page PG is a minimum unit in performing a program operation and a read operation. In the program operation and the read operation, all memory cells MC in the same page PG may simultaneously perform the corresponding operations.

The plurality of bit lines BL may be coupled with the column decoder 320 while being identified as odd-numbered bit lines BL and even-numbered bit lines BL.

In order to access memory cells MC, first, an address may be entered into the core area through the row decoder 310 and the column decoder 320 via an input/output terminal, and may designate target memory cells. Designating target memory cells means accessing memory cells MC located at sites where the word lines WL1 to WL9 coupled with the row decoder 310 and the bit lines BL coupled with the column decoder 320 intersect with each other, to program data to the memory cells MC or read out programmed data from the memory cells MC.

Since data is programmed and read via the data register 330 in all data processing operations of the memory device 110, the data register 330 plays a key role. If data processing of the data register 330 is delayed, all other areas need to wait until the data register 330 completes the data processing. Also, if the performance of the data register 330 degrades, the overall performance of the memory device 110 may degrade.

Referring to the illustration of FIG. 3, in one string STR, a plurality of transistors TR1 to TR9 which are coupled with the plurality of word lines WL1 to WL9 may exist. Areas where the plurality of transistors TR1 to TRn exist correspond to memory cells MC. The plurality of transistors TR1 to TR9 are transistors each of which includes a control gate CG and a floating gate FG as described above.

The plurality of word lines WL1 to WL9 include two outermost word lines WL1 and WL9. A first select line DSL may be additionally disposed outside a first outermost word line WL1 which is more adjacent to the data register 330 in terms of signal path between the two outermost word lines WL1 and WL9, and a second select line SSL may be additionally disposed outside a second outermost word line WL9 between the two outermost word lines WL1 and WL9.

A first select transistor D-TR which is on-off controlled by the first select line DSL is a transistor which has only a gate electrode coupled with the first select line DSL and does not include a floating gate FG. A second select transistor S-TR which is on-off controlled by the second select line SSL is a transistor which has only a gate electrode coupled with the second select line SSL and does not include a floating gate FG.

The first select transistor D-TR serves as a switch which turns on or off the coupling between a corresponding string STR and the data register 330. The second select transistor S-TR serves as a switch which turns on or off the coupling between the corresponding string STR and a source line SL. That is, the first select transistor D-TR and the second select transistor S-TR are positioned at both ends of the corresponding string STR, and serve as gatekeepers which couple and decouple signals.

In a program operation, because it is necessary to fill electrons in a target memory cell MC of a bit line BL which is to be programmed, the memory system 100 turns on the first select transistor D-TR by applying a predetermined turn-on voltage Vcc to the gate electrode of the first select transistor D-TR, and turns off the second select transistor S-TR by applying a predetermined turn-off voltage (e.g., 0V) to the gate electrode of the second select transistor S-TR.

In a read operation or a verify operation, the memory system 100 turns on both the first select transistor D-TR and the second select transistor S-TR. Accordingly, since current may be discharged to the source line SL corresponding to the ground through the corresponding string STR, a voltage level of the bit line BL may be measured. However, in the read operation, there may be a time difference between on-off timings of the first select transistor D-TR and the second select transistor S-TR.

In an erase operation, the memory system 100 may supply a predetermined voltage (e.g., +20V) to a substrate through the source line SL. In the erase operation, the memory system 100 floats both the first select transistor D-TR and the second select transistor S-TR, thereby providing infinite resistance. Accordingly, the memory system 100 is structured such that the first select transistor D-TR and the second select transistor S-TR do not function and electrons may operate due to a potential difference only between a floating gate FG and the substrate.

Figure 4:
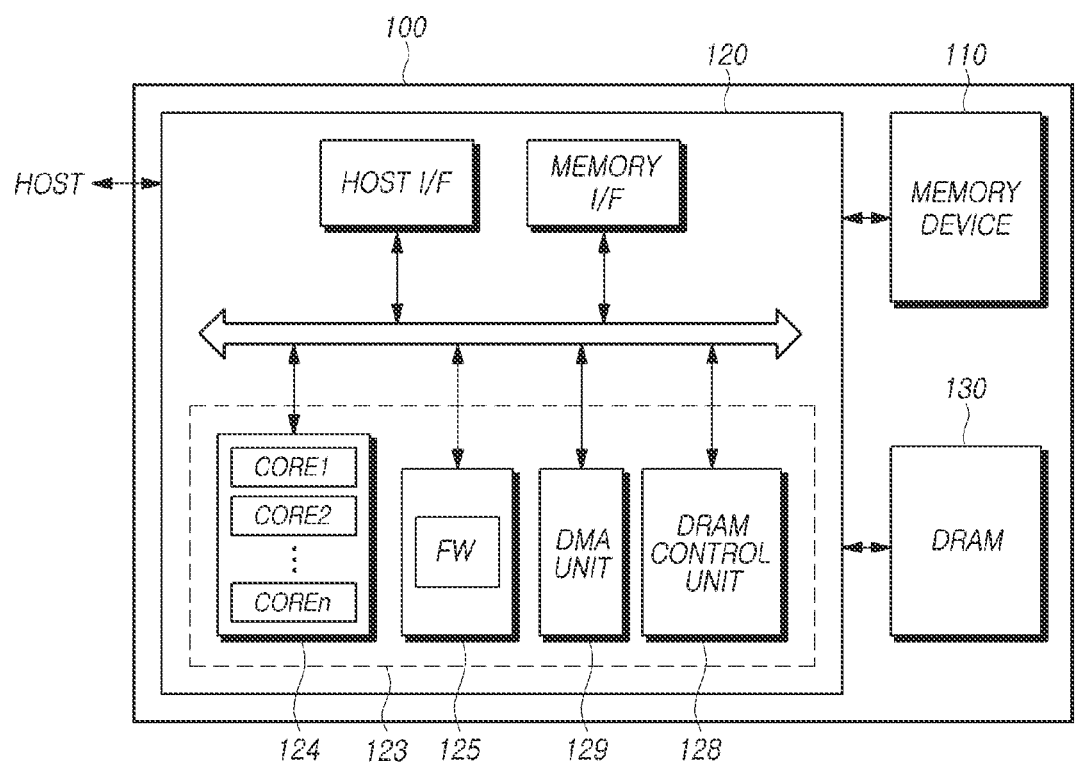
FIG. 4 is a diagram illustrating a plurality of cores, a volatile memory and a DRAM control unit based on an embodiment of the disclosed technology.

FIG. 4 is a diagram illustrating a plurality of cores, a volatile memory and a DRAM control unit based on an embodiment of the disclosed technology.

Referring to FIG. 4, the memory system 100 may include a volatile memory 130. The memory controller 120 may include a volatile memory control unit 128 for communicating with the volatile memory 130.

The volatile memory 130 as a medium capable of storing data, such as a DRAM, is a memory which requires continuous power supply to retain stored data. Data to be stored in the volatile memory 130 may be various data, for example, such as data loaded from another memory device (e.g., a NAND flash memory, a NOR flash memory, an FRAM, an MRAM and an SU-RAM) located inside or outside the memory system 100 or data generated through a logical calculation by the memory controller 120.

The volatile memory 130 may be accessed through a plurality of address fields. An address field is a set of one or more bits. The combination of the plurality of address fields may indicate the location of data which is stored in the volatile memory 130. Address fields used to access the volatile memory 130 may include a row address field, a bank address field, a column address field, and so forth. The plurality of address fields may be arranged in a specific order to form one address.

The processor 124 of the memory controller 120 may include a plurality of cores CORE1, CORE2, . . . , COREn. The plurality of cores CORE1, CORE2, . . . , COREn may operate independently of and in parallel to each other.

The processor 124 of the memory controller 120 may divide the volatile memory 130 into a plurality of subareas based on a reference address field among the plurality of address fields through execution of a firmware FW loaded in the working memory 125. The reference address field may be an address field including a most significant bit among the plurality of address fields arranged in a specific order, that is, a most significant address field. When the size of the most significant address field is smaller than the number of a plurality of cores, the reference address field may further include not only the most significant address field but also a second significant address field. When the number of the plurality of cores CORE1, CORE, . . . , COREn included in the memory controller 120 is n, the processor 124 of the memory controller 120 may divide the volatile memory 130 into n number of subareas through execution of the firmware FW. The volatile memory 130 may be divided as many times as the number of the plurality of cores CORE1, CORE2, . . . , COREn included in the memory controller 120, and a plurality of subareas SA1, SA2, . . . , SAn may be allocated to the plurality of cores CORE1, CORE2, . . . , COREn, respectively.

Each of the plurality of cores CORE1, CORE2, . . . , COREn included in the processor 124 of the memory controller 120 may generate a test signal corresponding to a test pattern to test the volatile memory 130. Test signals TS may be generated in parallel in the plurality of cores CORE1, CORE2, . . . , COREn. The test pattern is a data pattern used to determine whether the volatile memory 130 operates normally, and may be a predetermined pattern or a randomly generated pattern. Various test patterns may be used to test the volatile memory 130.

The memory controller 120 may transmit test signals generated by the plurality of cores CORE1, CORE2, . . . , COREn to the volatile memory 130 through the volatile memory control unit 128.

The volatile memory control unit 128 may provide an interface between the memory controller 120 and the volatile memory 130. Various data including data received from the outside or data generated by the memory controller 120 may be stored in the volatile memory 130 through the volatile memory control unit 128. Data stored in the volatile memory 130 may be provided to the memory controller 120 through the volatile memory control unit 128.

The memory controller 120 may further include a DMA unit 129. The DMA unit 129 which provides a DMA (direct memory access) may provide a continuous data access in a direction in which the address of the volatile memory 130 increases when the processor 124 of the memory controller 120 accesses the volatile memory 130. That is, the DMA unit 129 may cause data on the working memory 125 to be directly transmitted to the volatile memory 130 without intervention of the processor 124. In order for a DMA, the processor 124 may transmit a DMA request to DMA unit 129, and the DMA unit 129 may transmit data on the working memory 125 to the volatile memory control unit 128 on the basis of the DMA request. When data transmission is ended, the DMA unit 129 may transmit an interrupt indicating the end of data transmission to the processor 124. The memory controller 120 may effectively access data of consecutive and a wide range of addresses through the DMA unit 129. On the other hand, when the memory controller 120 accesses relatively small-sized data through the DMA unit 129, the rate of an overhead that occurs is when the processor 124 issues a DMA request may be large. In other words, if multiple accesses are made to relatively small-sized data, since an overhead through DMAs increases, a limitation may exist when the memory controller 120 applies a test signal of tight timing to the volatile memory 130.

The volatile memory control unit 128 and the DMA unit 129 may be included in the control circuit 123 included in the memory controller 120.

Figure 5:
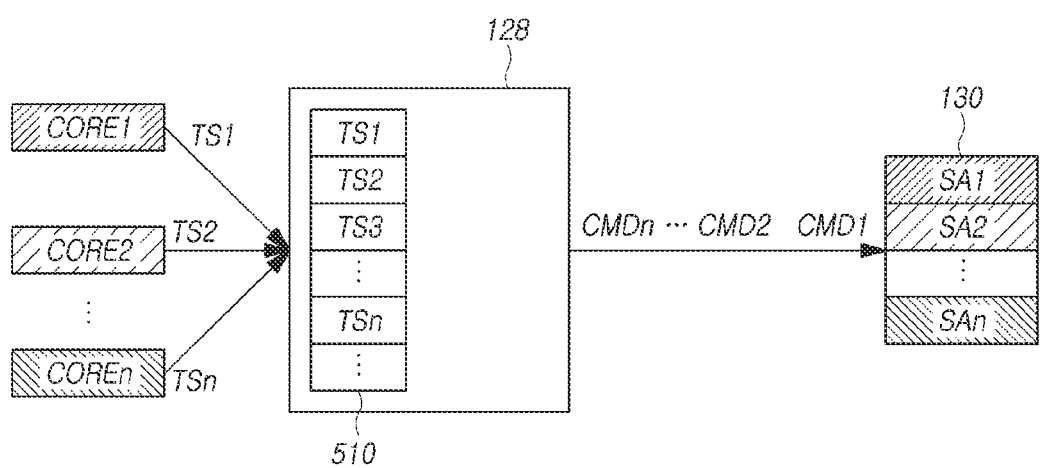
FIG. 5 is a diagram illustrating cores and subareas allocated to the cores in a memory system based on an embodiment of the disclosed technology.

FIG. 5 is a diagram illustrating cores and subareas allocated to the cores in a memory system based on an embodiment of the disclosed technology.

Referring to FIG. 5, the volatile memory 130 may be divided into the plurality of subareas SA1, SA2, . . . , SAn, and the plurality of subareas SA1, SA2, . . . , SAn may be allocated to the plurality of cores CORE1, CORE2, . . . , COREn. Test signals TS1, TS2, . . . , and TSn generated by the plurality of cores CORE1, CORE2, . . . , COREn may be transmitted to the volatile memory control unit 128. The test signals TS1, TS2, . . . , TSn may be generated in parallel.

The subareas SA1, SA2, . . . , SAn corresponding to the plurality of cores CORE1, CORE2, . . . , COREn, respectively, may be allocated to the plurality of cores CORE1, CORE2, . . . , COREn, respectively. For example, a first subarea SA1 may be allocated to a first core CORE1, and a second subarea SA2 may be allocated to a second core CORE2. When the memory controller 120 includes n number of cores, where n is an integer equal to or greater than 2, the volatile memory 130 may be divided into n number of subareas, and at least one subarea may be allocated to each of the plurality of cores CORE1, CORE2, . . . , COREn.

The first core CORE1 may generate a first test signal TS1, and the second core CORE2 may generate a second test signal TS2. The test signals TS1, TS2, . . . , TSn generated by the plurality of cores CORE1, CORE2, . . . , COREn, such as the first test signal TS1 and the second test signal TS2, may be transmitted to the volatile memory control unit 128 during one command cycle.

The volatile memory control unit 128 may include a queue 510. The volatile memory control unit 128 may receive the test signals TS1, TS2, . . . , TSn generated by the plurality of cores CORE1, CORE2, . . . , COREn and enqueue them in the queue 510. The volatile memory control unit 128 may dequeue the test signals TS1, TS2, . . . , TSn and generate commands CMD1, CMD2, . . . , CMDn for controlling the volatile memory 130.

The volatile memory control unit 128 may transmit the commands CMD1, CMD2, . . . , CMDn corresponding to the test signals TS1, TS2, . . . , TSn, respectively, to the volatile memory 130.

The volatile memory 130 may receive the commands CMD1, CMD2, . . . , CMDn corresponding to the test signals TS1, TS2, . . . , TSn from the volatile memory control unit 128, and may perform operations corresponding to the respective commands CMD1, CMD2, . . . , CMDn. A test on the first subarea SA1 may be performed by a first command CMD1 corresponding to the first test signal TS1, and a test on the second subarea SA2 may be performed by a second command CMD2 corresponding to the second test signal TS2. Similarly, a test on an nth subarea SAn may be performed by an nth command CMDn corresponding to an nth test signal TSn.

The commands CMD1, CMD2, ..., CMDn received by the volatile memory 130 may be commands necessary to test the volatile memory 130, such as a write command and a read command. The volatile memory 130 may write or read data to or from a corresponding subarea among the plurality of subareas SA1, SA2, ..., SAn according to the received commands CMD1, CMD2, ..., CMDn.

Through this, the plurality of cores CORE1, CORE2, ..., COREn may access the subareas SA1, SA2, ..., SAn, respectively, allocated thereto by regarding the subareas SA1, SA2, ..., SAn as separate memories. The plurality of cores CORE1, CORE2, ..., COREn may generate in parallel the plurality of test signals TS1, TS2, ..., TSn, and due to this fact, the number of commands for writing a test pattern or reading data to or from the volatile memory 130 per time may be increased. Namely, as the plurality of cores CORE1, CORE2, ..., COREn generate in parallel the plurality of test signals TS1, TS2, ..., TSn, a large amount of workload to be processed by the volatile memory 130 may be realized. When testing the volatile memory 130, as commands corresponding to test signals are generated and transmitted with tight timing, the screening performance of a test on the volatile memory 130 may be increased.

FIG. 6 is a timing diagram illustrating timings of a clock and a command inputted to a memory based on an embodiment of the disclosed technology.

Referring to FIG. 6, the memory controller 120 may transfer a command CMD to the volatile memory 130 with tight timing.

In (A) of FIG. 6, timings of a clock CLK inputted to the volatile memory 130 and the command CMD which is transferred using the DMA unit 129 from the processor 124, are illustrated. tCCD_L means the number of clock cycles that are allowed between consecutive read/write commands in the same bank group. As described above, when the processor 124 accesses relatively small-sized data through the DMA unit 129, an overhead due to a DMA request or the like may occur. Delay due to the occurrence of the overhead is intensified in a test pattern which skips an upper address field. This serves as a limitation in applying a test signal to the volatile memory 130 with tight timing. In (A) of FIG. 6, tCCD_L is set to 8, but a delay OD by an overhead corresponding to 2 clocks may occur due to a time required for a DMA request between the processor 124 and the DMA unit 129, a time required for processing in the DMA unit 129 and a time required for processing in the volatile memory control unit 128. Accordingly, the interval between WR commands CMD becomes 10 clocks, and a limitation exists in performing a test on the volatile memory 130 with tight timing.

In (B) of FIG. 6, timings when test signals are generated in the plurality of cores CORE1, CORE2, ..., COREn and are directly transferred to the volatile memory control unit 128, are illustrated. As the plurality of cores CORE1, CORE2, ..., COREn generate in parallel the test signals and access the volatile memory 130 without passing through the DMA unit 129, a processing time required in the DMA unit 129 may be shortened. Therefore, the delay OD by the overhead does not occur, and the interval between WR commands CMD becomes 8 clocks as the set value of tCCD_L. Through this, it is possible to perform a test on the volatile memory 130 with tight timing.

FIG. 7 is a diagram illustrating address bits and address fields of a memory based on an embodiment of the disclosed technology.

Referring to FIG. 7, the memory controller 120 may divide the volatile memory 130 into the plurality of subareas SA1, SA2, SA3, ..., SAn on the basis of a reference address field AF_R among a plurality of address fields.

An address field AF used to access the volatile memory 130 may be divided into an upper address field AF_H including at least a most significant bit MSB and a lower address field AF_L including bits relatively lower than the upper address field AF_H. The address field AF may further include a middle address field AF_M including bits lower than the upper address field AF_H and higher than the lower address field AF_L. The address field AF of the volatile memory 130 may further include an additional address field as well as the upper address field AF_H, the middle address field AF_M and the lower address field AF_L. The address field AF may be determined in various ways according to the structure and operation scheme of the volatile memory 130.

The upper address field AF_H as an address field including the most significant bit MSB is the reference address field AF_R. When the volatile memory 130 is divided on the basis of the upper address field AF_H, test signals may be generated in the plurality of cores CORE1, CORE2, ..., COREn in units of addresses corresponding to the upper address field AF_H.

According to the illustration of FIG. 7, the most significant bit MSB is 15, 0 to 4 among address bits correspond to the lower address field AF_L, 5 to 7 correspond to the middle address field AF_M, and 8 to 15 correspond to the upper address field AF_H.

The upper address field AF_H may be expressed by a total of 8 bits, and may have values from 0 to 255.

The volatile memory 130 may be divided into total n number of subareas SA1, SA2, SA3, ... SAn including a first subarea SA1 having upper addresses from 0 to a, a second subarea SA2 having upper addresses from a+1 to b and a third subarea SA3 having upper addresses from b+1 to c.

The n number of subareas SA1, SA2, SA3, ... SAn may be allocated to the plurality of cores CORE1, CORE2, ..., COREn, respectively, included in the memory controller 120, and the plurality of cores CORE1, CORE2, ..., COREn may generate test signals for the respective subareas SA1, SA2, SA3, ... SAn.

Since test signals corresponding to test patterns are generated in parallel in the plurality of cores CORE1, CORE2, ..., COREn, test signals for testing the volatile memory 130 may be generated in units of upper addresses including most significant bits MSB. A command for writing data corresponding to a test signal to the volatile memory 130 or a command for reading data stored in the volatile memory 130 may also be generated in units of upper addresses including most significant bits MSB. Through this, a test signal corresponding to a test pattern which skips upper addresses may be generated, and a large amount of workload similar to the actual use of the memory system 100 may be realized.

Figure 8:
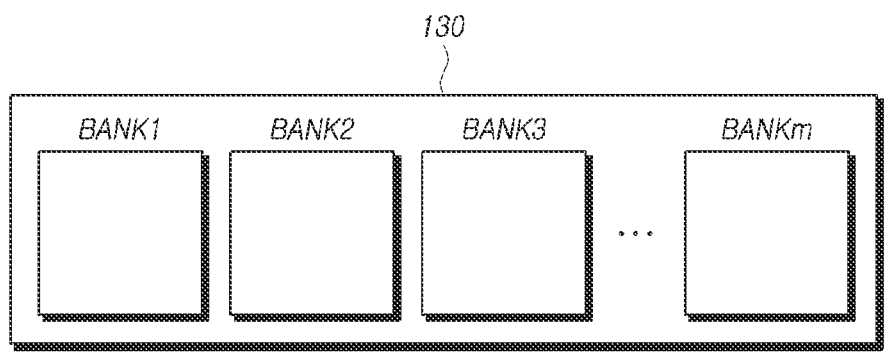
FIG. 8 is a diagram illustrating a memory and banks based on an embodiment of the disclosed technology.

FIG. 8 is a diagram illustrating a memory and banks based on an embodiment of the disclosed technology.

Referring to FIG. 8, the volatile memory 130 may include a plurality of banks BANK1, ..., BANKm.

Each of the plurality of banks BANK1, ..., BANKm may include a plurality of memory cells which are defined by rows and columns. The memory cells included in the plurality of banks BANK1, ..., BANKm may be DRAM cells.

Each DRAM cell may include a cell capacitor and a cell transistor. The cell transistor may electrically couple a bit line and the cell capacitor, and the gate of the cell transistor may be coupled to a word line. The cell capacitor may be charged with charges through a bit line voltage applied to the bit line, and may store a bit value on the basis of the charged charges. Each of the plurality of banks BANK1, . . . , BANKm may include a sense amplifier for sensing and amplifying the voltage of the cell capacitor when reading data stored in the DRAM cell. The sense amplifier may sense and amplify the voltage level of the bit line when reading data stored in the memory cell, and may output an output to the outside of a DRAM cell array.

Figure 9:
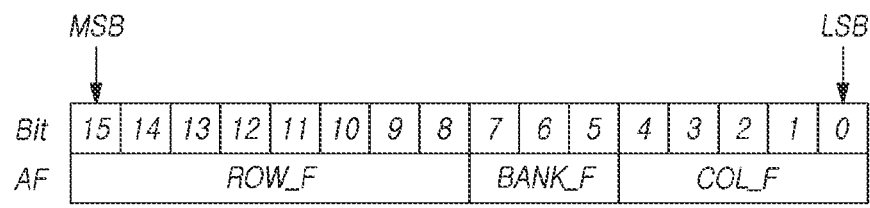
FIG. 9 is a diagram illustrating an example of an address field of a memory based on an embodiment of the disclosed technology.

FIG. 9 is a diagram illustrating an example of an address field of a memory based on an embodiment of the disclosed technology.

FIG. 10 is a diagram illustrating an example of subareas of FIG. 9 based on an embodiment of the disclosed technology.

Referring to FIGS. 9 and 10, the address field AF of the volatile memory 130 may include a row address field ROW_F, a bank address field BANK_F and a column address field COL_F. In an address, a value corresponding to the row address field ROW_F may indicate a specific row of the volatile memory 130, a value corresponding to the bank address field BANK_F may indicate a specific bank of the volatile memory 130, and a value corresponding to the column address field COL_F may indicate a specific column of the volatile memory 130.

Since the volatile memory 130 is divided on the basis of the reference address field AF_R, when the reference address field AF_R is the row address field ROW_F which is a most significant address field, the volatile memory 130 may be divided by the number of cores on the basis of a most significant bit MSB in terms of row. In the address field AF of the volatile memory 130, an upper address field may be the row address field ROW_F, a middle address field may be the bank address field BANK_F, and a lower address field may be the column address field COL_F.

According to the illustration of FIG. 9, the row address field ROW_F may be constituted by 8 bits including the most significant bit MSB, the bank address field BANK_F may be constituted by 3 bits following the row address field ROW_F, and the column address field COL_F may be constituted by 5 bits following the bank address field BANK_F.

When all addresses of the volatile memory 130 are used, row addresses may have a range from 0 to 255, bank addresses may have a range from 0 to 7, and column addresses may have a range from 0 to 31.

According to the illustration of FIG. 10, when the number of a plurality of cores included in the memory controller 120 is 4, a subarea having row addresses from 0 to 63 in the volatile memory 130 may be divided as a first subarea SA1, a subarea having row addresses from 64 to 127 may be divided as a second subarea SA2, a subarea having row addresses from 128 to 191 may be divided as a third subarea SA3, and a subarea having row addresses from 192 to 255 may be divided as a fourth subarea A4.

The first subarea SA1 to the fourth subarea SA4 may be allocated to the plurality of cores, respectively, included in the memory controller 120.

The first subarea SA1 may be allocated to the first core CORE1, and the second subarea SA2 may be allocated to the second core CORE2. Conversely, the first subarea SA1 may be allocated to the second core CORE2, and the second subarea SA2 may be allocated to the first core CORE1.

Because the volatile memory 130 is divided on the basis of a row address field including the most significant bit MSB, divided subareas are allocated to respective cores of the memory controller 120 and test signals are generated in parallel in the plurality of cores, test signals for testing the volatile memory 130 may be generated in units of row addresses. Since the test signals generated in units of row addresses are similar to data patterns during actual use of the memory system 100 which are generated by skipping row addresses, write commands or read commands in units of rows may be applied to the volatile memory 130 with tight timing. Through this, it is possible to increase screening capability of a test on the volatile memory 130.

Figure 11:
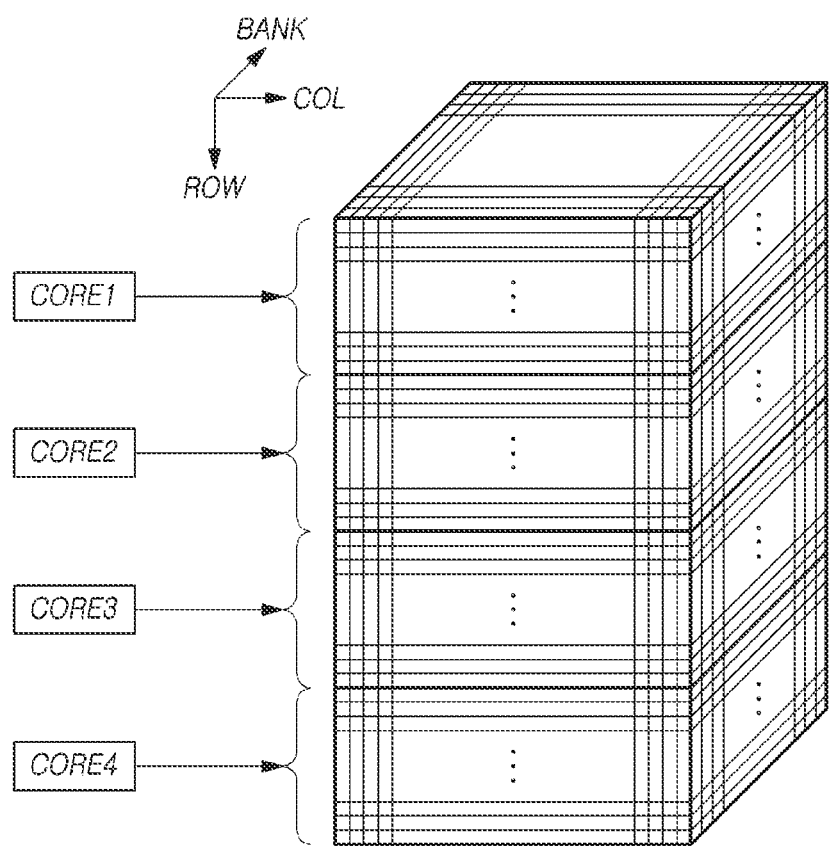
FIG. 11 is a diagram illustrating 3D addresses of a memory and cores to which subareas are allocated, based on an embodiment of the disclosed technology.

FIG. 11 is a diagram illustrating 3D addresses of a memory and cores to which subareas are allocated, based on an embodiment of the disclosed technology.

FIG. 11 illustrates that subareas of the volatile memory 130 are allocated to four cores included in the memory controller 120. Subareas divided into 4 in terms of row are allocated to four cores CORE1, CORE2, CORE3 and CORE4.

Figure 12:
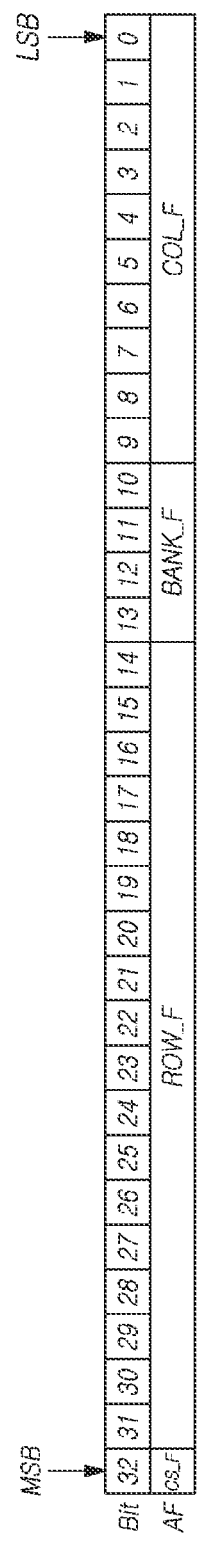
FIG. 12 is a diagram illustrating another example of an address field of a memory based on an embodiment of the disclosed technology.

FIG. 12 is a diagram illustrating another example of an address field of a memory based on an embodiment of the disclosed technology.

Figure 13:
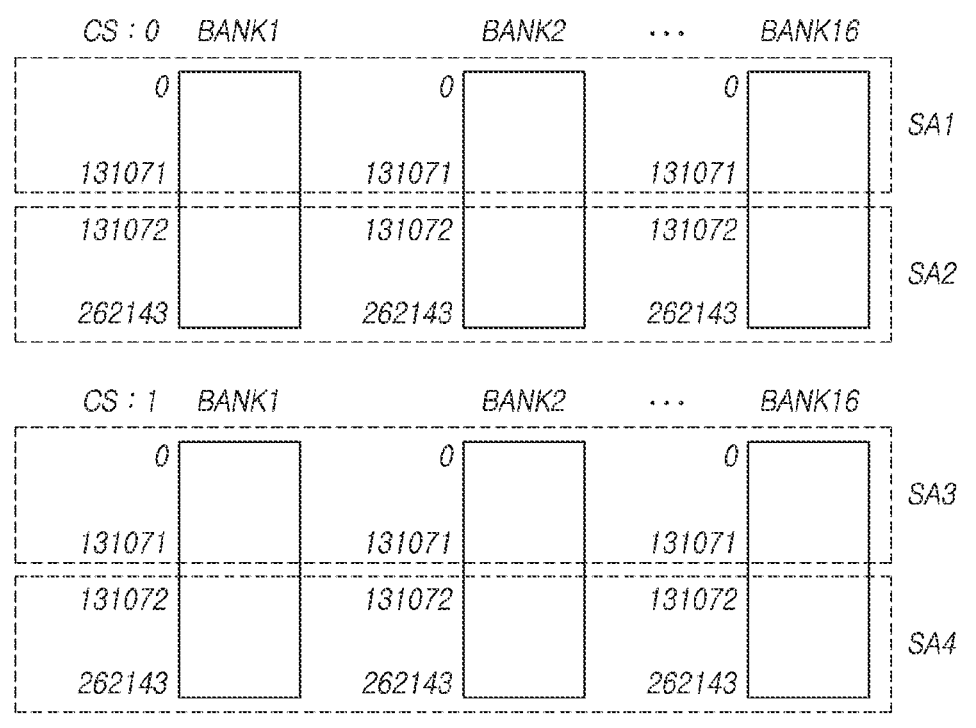

FIG. 13 is a diagram illustrating subareas of FIG. 12 based on an embodiment of the disclosed technology.

Referring to FIGS. 12 and 13, the address field AF of the volatile memory 130 may further include a chip select field CS_F which is upper than the row address field ROW_F.

The memory system 100 may have a memory structure of at least a dual rank. A chip select signal CS for selecting an appropriate rank is required.

The chip select field CS_F as a field corresponding to the chip select signal CS may be used in the memory system 100 to which a structure of at least a dual rank is applied.

According to the illustration of FIG. 12, in order to represent an address of the volatile memory 130, from a least significant bit LSB, bits as the column address field COL_F, 4 bits as the bank address field BANK_F, eighteen bits as the row address field ROW_F and 1 bit being a most significant bit MSB as the chip select field CS_F may be used.

A column address may have values from 0 to 1024, a bank address may have values from 0 to 15, a row address may have values from 0 to 262143, and the chip select signal CS may have a value of 0 or 1.

When the memory controller 120 includes two cores, a subarea whose chip select signal CS is 0 may be allocated to a first core, and a subarea whose chip select signal CS is 1 may be allocated to a second core.

When the memory controller 120 includes four cores, as illustrated in FIG. 13, the chip select signal CS of 0 and row addresses from 0 to 131071 may be divided as a first subarea SA1, the chip select signal CS of 0 and row addresses from 131072 to 262143 may be divided as a second subarea SA2, the chip select signal CS of 1 and row addresses from 0 to 131071 may be divided as a third subarea SA3, and the chip select signal CS of 1 and row addresses from 131072 to 262143 may be divided as a fourth subarea SA4. The divided first subarea SA1 to fourth subarea SA4 may be allocated to first to fourth cores.

Through this, in the memory system 100 to which a structure of at least a dual rank is applied, the volatile memory 130 may be divided into a plurality of subareas, and the plurality of subareas may be allocated to a plurality of cores included in the memory controller 120.

FIG. 14 is a diagram illustrating examples of test patterns based on an embodiment of the disclosed technology.

Referring to FIG. 14, a test pattern may be one of a gross test pattern T_G, a march test pattern T_M and a jump test pattern T_XJ.

In the gross test pattern T_G, data is written sequentially according to column-row addresses over the entirety of a memory area, and performs a test by reading data from a first start address in order in which the data is written.

In the march test pattern T_M, 0 is written to the entirety of an area, and after reading a first address, 1 is written. Thereafter, after reading a next address, 1 is written. After repeatedly performing this, a test is conducted by reading 1 written in the entire area. The march test pattern T_M may be classified as a Y march test pattern sequentially conducted according to column-row addresses and an X march test pattern sequentially conducted according to row-column addresses.

In the jump test pattern T_XJ, a test is conducted in such a way to repeat read and write by skipping rows by a set size.

A read or write operation on the volatile memory 130 may be performed by the unit of a burst length.

The above-described test patterns are nothing but mere examples, and various test patterns may be used to test a memory.

Figure 15:
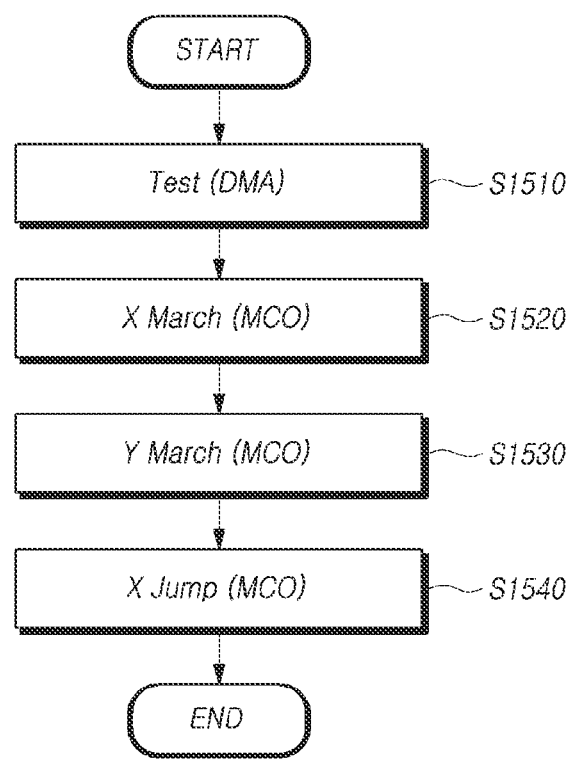
FIG. 15 is a flowchart illustrating an example of an initial inspection process of a memory system based on an embodiment of the disclosed technology.

FIG. 15 is a flowchart illustrating an example of an initial inspection process of a memory system based on an embodiment of the disclosed technology.

Referring to FIG. 15, test signals by a plurality of cores may be generated during an initial inspection of the memory system 100.

The initial inspection of the memory system 100 relates to a product test, and is a test for checking whether the memory system 100 operates normally. The initial inspection of the memory system 100 may be conducted through one or more steps. As an example, the initial inspection may include operation S1510 in which the memory controller 120 performs a test on the volatile memory 130 through the DMA unit 129. At the operation S1510, the memory controller 120 may transmit test signals for testing the entire area of the volatile memory 130 sequentially according to addresses to the volatile memory 130. At the operation S1510 of performing a test on the volatile memory 130 through the DMA unit 129, various algorithms may be used. As a test pattern includes the gross test pattern T_G described above, a test may be performed on a 1-column bar test pattern in which 0 and 1 are alternately written in a column direction, a 1-row bar test pattern in which 0 and 1 are alternately written in a row direction, a 2-row bar test pattern in which a pair of 0 and a pair of 1 are alternately written and a read repetition test pattern in which a read operation is repeated. At the operation S1510, the processor 124 may transmit a DMA request to the DMA unit 129, and, in response to the DMA request, the DMA unit 129 may transmit a test pattern in the firmware FW loaded in the working memory 125 to the volatile memory control unit 128.

The initial inspection of the memory system 100 may include operation S1520 in which the memory controller 120 performs an X march test on the volatile memory 130 using test signals generated by the plurality of cores.

The initial inspection of the memory system 100 may include operation S1530 in which the memory controller 120 performs a Y march test on the volatile memory 130 using test signals generated by the plurality of cores.

The initial inspection of the memory system 100 may include operation S1540 in which the memory controller 120 performs a jump test on the volatile memory 130 using test signals generated by the plurality of cores.

At the operations S1520, S1530 and S1540, the plurality of cores may generate independently and in parallel test signals corresponding to set test patterns. Test signals generated by the plurality of cores are transmitted to the volatile memory control unit 128 and are converted therein into commands for controlling the volatile memory 130, and the commands are transmitted to the volatile memory 130.

Figure 16:
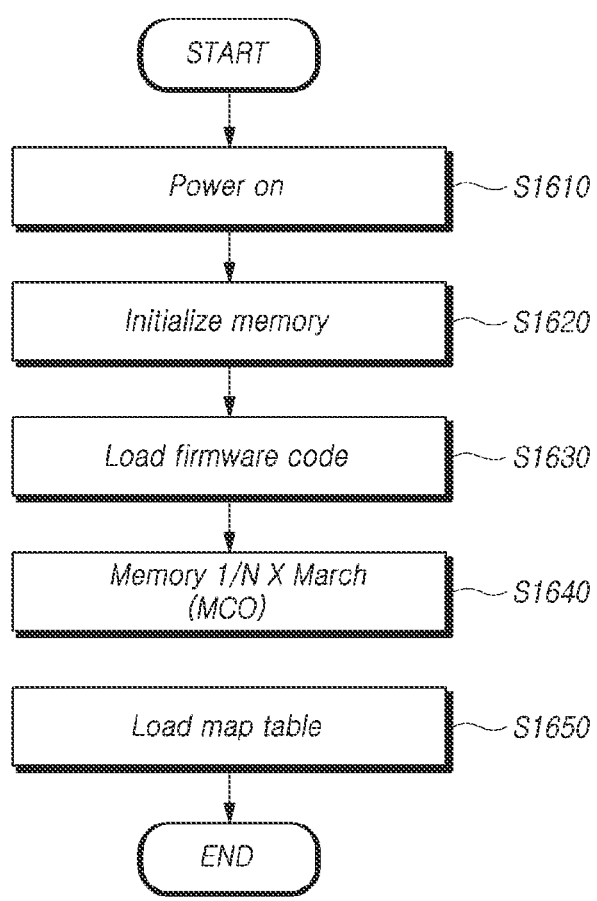
FIG. 16 is a flowchart illustrating an example of a booting process of a memory system based on an embodiment of the disclosed technology.

FIG. 16 is a flowchart illustrating an example of a booting process of a memory system based on an embodiment of the disclosed technology.

Referring to FIG. 16, test signals by a plurality of cores may be generated during a booting process of the memory system 100.

The process in which the memory system 100 is booted may include power-on operation S1610, memory initialization operation S1620, firmware code load operation S1630 and map table load operation S1650. The memory controller 120 may perform partial memory test operation S1640 before the map table load operation S1650 is performed after the firmware code load operation S1630. In consideration of a limited booting time, the partial memory test operation S1640 may not test the entire area of the volatile memory 130, but may perform a test on an 1/N area of the entire area of the volatile memory 130. In this case, a test on a partial area of the volatile memory 130 may be performed using test signals generated by the plurality of cores. A test pattern corresponding to an X march test may be used.

Figure 17:
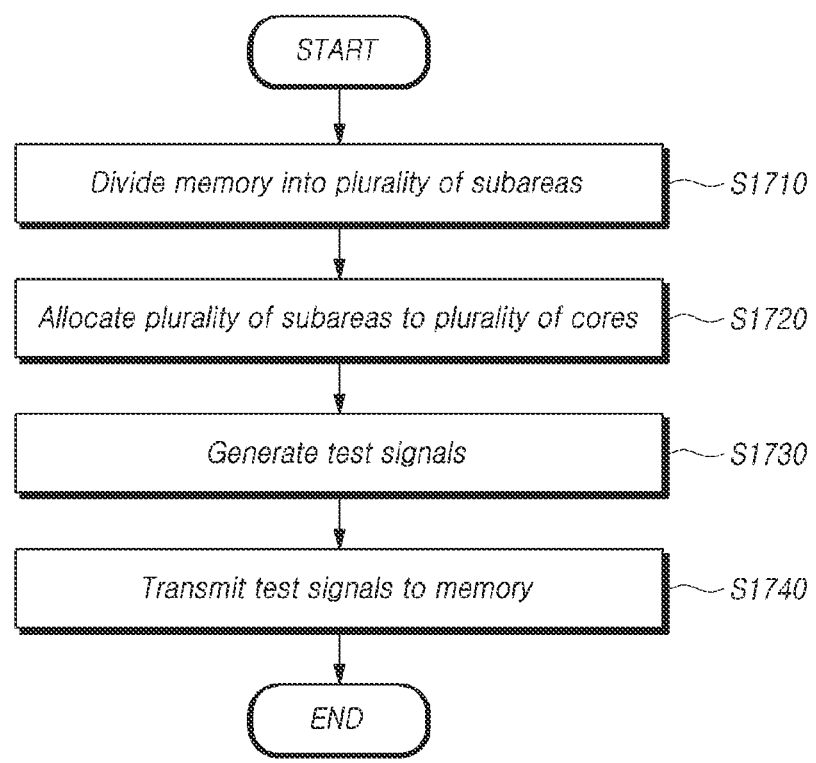
FIG. 17 is a flowchart illustrating a method for operating a memory system based on an embodiment of the disclosed technology.

FIG. 17 is a flowchart illustrating a method for operating a memory system based on an embodiment of the disclosed technology.

Referring to FIG. 17, the method for operating the memory system 100 may include operation S1710 of dividing the volatile memory 130 into a plurality of subareas on the basis of a most significant address field among a plurality of address fields for an access to the volatile memory 130, operation S1720 of allocating the plurality of subareas to a plurality of cores, respectively, operation S1730 of generating test signals through the plurality of cores, and operation S1740 of transmitting the test signals to the volatile memory 130.

The operation S1730 of generating the test signals and the operation S1740 of transmitting the test signals to the volatile memory 130 may be performed in an initial inspection of the memory system 100.

The method for operating the memory system 100 may further include an operation of transmitting test signals for testing the entire area of the volatile memory 130 sequentially according to addresses, to the volatile memory 130 through a DMA during the initial inspection of the memory system 100.

The operation S1730 of generating the test signals and the operation S1740 of transmitting the test signals to the volatile memory 130 may be performed in a booting process of the memory system 100.

Figure 18:
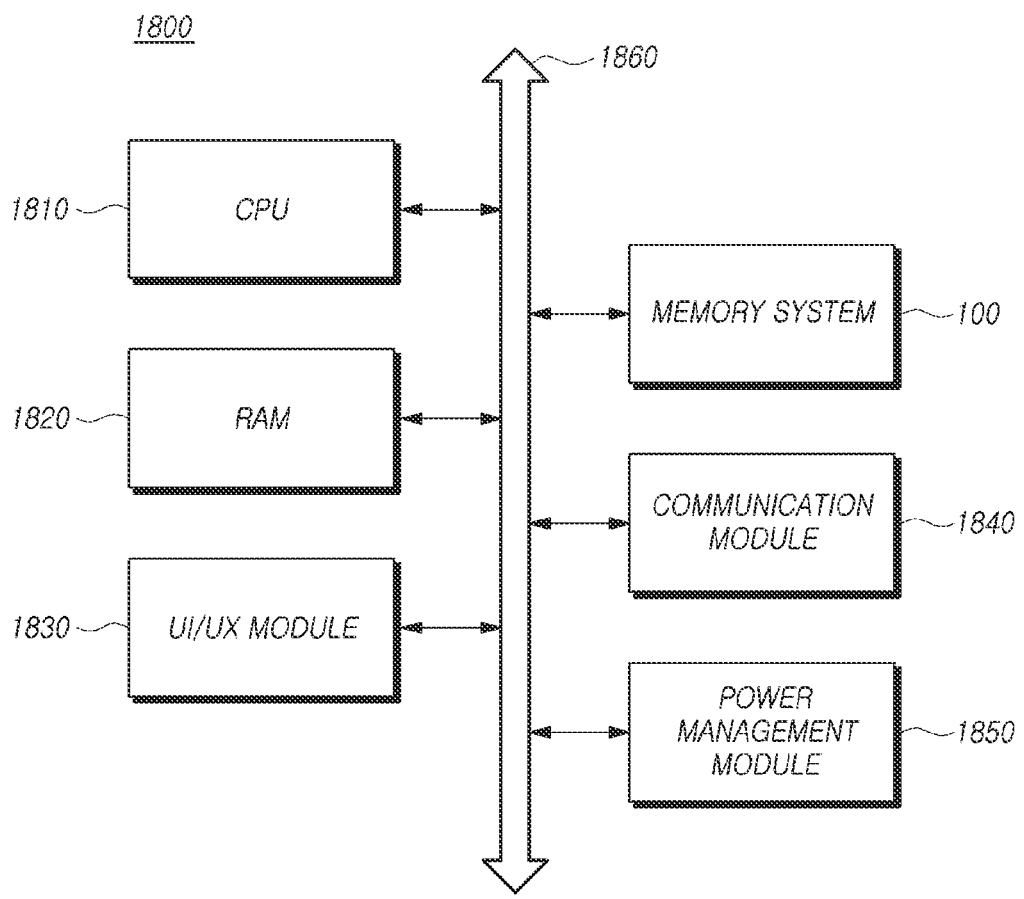
FIG. 18 is a configuration diagram of a computing system based on an embodiment of the disclosed technology.

FIG. 18 is a configuration diagram of a computing system based on an embodiment of the disclosed technology.

Referring to FIG. 18, a computing system 1800 based on an embodiment of the disclosed technology may include a memory system 100, a central processing unit (CPU) 1810 for controlling general operations of the computing system 1800, a random access memory (RAM) 1820 for storing data and information related with operations of the computing system 1800, a UI/UX (user interface/user experience) module 1830 for providing use environment to a user, a communication module 1840 for communicating with an external device in a wired and/or wireless manner and a power management module 1850 for managing power used by the computing system 1800, which are electrically coupled to a system bus 1860.

The computing system 1800 may include a PC (personal computer), a mobile terminal such as a smartphone, a tablet, and various electronic devices.

The computing system 1800 may further include a battery for supplying an operating voltage, and may further include an application chipset, a graphic-related module, a camera image processor, a DRAM and so forth. Besides, one of skilled in the art to which the disclosed technology pertains would understand that the computing system 1800 may include other components.

The memory system 100 may include not only a device which stores data in a magnetic disk, such as a hard disk drive (HDD), but also a device which stores data in a nonvolatile memory, such as a solid state drive (SDD), a universal flash storage (UFS) device and an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be incorporated into various types of storage devices, and may be mounted in various electronic devices.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A memory system comprising:
   a nonvolatile memory configured to store data;
   a volatile memory accessed through a plurality of address fields, and divided into a plurality of subareas on the basis of a reference address field among the plurality of address fields; and
   a memory controller configured to control the nonvolatile memory using the volatile memory, and
   the memory controller including:
   a plurality of cores, to which the plurality of subareas are allocated; and
   a volatile memory control unit,
   wherein each of the plurality of cores is configured to generate in parallel test signals, having respective test patterns for testing whether the volatile memory is operating normally, and transmit the test signals to the volatile memory control unit, and
   wherein the volatile memory control unit is configured to transmit, to the volatile memory, commands corresponding to the respective test signals by a) enqueuing the test signals, b) dequeuing the test signals, and c) sending the commands corresponding to the respective test signals to each subarea for execution of the test patterns.

2. The memory system according to claim 1, wherein the reference address field is a most significant address field among the plurality of address fields.

3. The memory system according to claim 1, wherein:
   the volatile memory includes a plurality of banks, and
   each of the plurality of banks includes a plurality of memory cells which are defined by rows and columns.

4. The memory system according to claim 3, wherein the reference address field is a row address field which indicates the rows.

5. The memory system according to claim 3, wherein:
   the reference address field includes a chip select field.

6. The memory system according to claim 1, wherein the plurality of cores are flash translation layer (FTL) cores or host interface layer (HIL) cores.

7. The memory system according to claim 1, wherein the test patterns include at least one of a march test pattern and a jump test pattern.

8. The memory system according to claim 1, wherein the cores generate the test signals in an initial inspection of the memory system.

9. The memory system according to claim 1, wherein the cores generate the test signals in a booting process of the memory system.

10. A memory controller comprising:
    a processor configured to control a nonvolatile memory using a volatile memory, and the processor including a plurality of cores, to which a plurality of subareas divided on the basis of a reference address field among a plurality of address fields for an access to a volatile memory are allocated, each of the plurality of cores being configured to generate in parallel test signals, having respective test patterns for testing whether the volatile memory is operating normally; and
    a volatile memory control unit configured to:
    provide interface with the plurality of subareas of the volatile memory, and
    transmit, to the volatile memory, commands corresponding to the respective test signals by a) enqueuing the test signals, b) dequeuing the test signals, and c) sending the commands corresponding to the respective test signals to each subarea for execution of the test patterns.

11. The memory controller according to claim 10, wherein the reference address field is a most significant address field among the plurality of address fields.

12. The memory controller according to claim 10, wherein the reference address field is a row address field which indicates a row of the volatile memory.

13. The memory controller according to claim 10, wherein the reference address field includes a chip select field.

14. The memory controller according to claim 10, wherein the plurality of cores are flash translation layer (FTL) cores or host interface layer (HIL) cores.

15. A memory system comprising:
    a non-volatile memory device;
    a volatile memory device;
    a direct memory access (DMA) unit; and
    a controller configured to:
    control the non-volatile memory device to perform an operation,
    request the DMA unit to control the volatile memory device to perform an operation, and
    perform, without involvement of the DMA unit, a test operation independently on each of groups of the volatile memory device,
    wherein each of the groups includes rows of memory cells within the volatile memory device, wherein the controller is configured to generate in parallel test signals, having respective test patterns for testing whether the volatile memory is operating normally, and transmit commands corresponding to the respective test signals to the volatile memory device by a) enqueuing the test signals, b) dequeuing the test signals, and c) sending the commands corresponding to the respective test signals to each group for execution of the test patterns.

16. The memory system according to claim 15, wherein the controller is configured to transmit, to the volatile memory device through the DMA unit during an initial inspection, test signals for testing an entire area of the volatile memory device sequentially according to addresses.

17. The memory system according to claim 15, wherein the controller is configured to generate test signals and transmit the test signals to the volatile memory device in a booting process.

18. The memory system according to claim 15, wherein the controller includes a plurality of cores, to which a plurality of subareas divided on the basis of a reference address field among a plurality of address fields for an access to the volatile memory device are allocated, the cores being configured to generated test signals corresponding to respective test patterns.

19. The memory system according to claim 18, wherein the reference address field is a most significant address field among the plurality of address fields.

20. The memory system according to claim 18, wherein the reference address field is a row address field which indicates the rows of the memory cells within the volatile memory device.

* * * * *